(12) United States Patent
Hata et al.

(10) Patent No.: US 7,452,315 B2
(45) Date of Patent: Nov. 18, 2008

(54) TOOL EXCHANGE DEVICE AND TOOL

(75) Inventors: Kanji Hata, Katano (JP); Shoriki Narita, Hirakata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/933,738

(22) Filed: Nov. 1, 2007

(65) Prior Publication Data

US 2008/0058186 A1     Mar. 6, 2008

Related U.S. Application Data

(62) Division of application No. 10/538,178, filed as application No. PCT/JP03/15568 on Dec. 4, 2003, now Pat. No. 7,306,551.

(30) Foreign Application Priority Data

Dec. 13, 2002    (JP)    ............... 2002-361626

(51) Int. Cl.
    *B23Q 3/155*    (2006.01)
(52) U.S. Cl. ............... 483/16; 483/58; 483/59
(58) Field of Classification Search ............ 483/28, 483/29; 72/462, 481.1, 482.5, 482.93; 73/698.91
    See application file for complete search history.

(56) References Cited

U.S. PATENT DOCUMENTS

| | | | |
|---|---|---|---|
| 4,739,145 A | | 4/1988 | Check et al. |
| 4,996,762 A | | 3/1991 | Takayama |
| 5,127,293 A | * | 7/1992 | Chatham ............ 83/136 |
| 5,454,775 A | | 10/1995 | Cullen et al. |
| 5,752,424 A | * | 5/1998 | Rosene et al. ......... 83/686 |
| 5,934,165 A | * | 8/1999 | Chatham ............ 83/588 |
| 5,993,364 A | | 11/1999 | Matsuura et al. |
| 6,161,279 A | * | 12/2000 | Suboski ............ 29/798 |

(Continued)

FOREIGN PATENT DOCUMENTS

JP    56-28894    3/1981

(Continued)

OTHER PUBLICATIONS

JPO Website Translation of JP 08-099246A.*

(Continued)

*Primary Examiner*—Dana Ross
(74) *Attorney, Agent, or Firm*—Greenblum & Bernstein, P.L.C.

(57) ABSTRACT

Step portions with an L-shaped section each having a vertical restriction surface and a horizontal engagement surface are provided on both sides of a main body portion of a tool. On one side of a holding portion placing and holding a mounted tool to be exchanged, a first engagement member has a first engagement projection piece that opposes the engagement surface of one of the step portions, and has an end surface in abutment against the restriction surface. On the other side of the holding portion, a second engagement member has a second engagement projection piece having its intermediate part opposed to the engagement surface of the other of the step portions, and end surfaces on both sides are in abutment against the outer periphery of the main both portion on both sides thereof. The first and second engagement members are movable between an engagement position and a withdrawal position with respect to the step portions.

2 Claims, 4 Drawing Sheets

U.S. PATENT DOCUMENTS

| | | | |
|---|---|---|---|
| 6,256,857 B1 * | 7/2001 | Roseliep | 29/428 |
| 6,334,381 B1 * | 1/2002 | Chatham | 83/588 |
| 6,334,840 B1 | 1/2002 | Asai et al. | |
| 6,371,350 B2 * | 4/2002 | Gonnet et al. | 227/119 |
| 6,466,837 B1 | 10/2002 | Mimura et al. | |
| 6,519,831 B2 * | 2/2003 | Futamura et al. | 29/564.7 |
| 6,594,887 B1 | 7/2003 | Okuda et al. | |
| 6,773,381 B2 | 8/2004 | Andersch | |
| 6,895,797 B2 * | 5/2005 | Lowry et al. | 72/480 |
| 7,029,210 B2 * | 4/2006 | Schlagenhauf | 408/153 |
| 7,059,162 B1 * | 6/2006 | Tarpill et al. | 72/112 |
| 2003/0027699 A1 * | 2/2003 | Brodie et al. | 483/28 |

FOREIGN PATENT DOCUMENTS

| | | | |
|---|---|---|---|
| JP | 1-113399 | | 7/1989 |
| JP | 3-109784 | | 11/1991 |
| JP | 08099246 A | * | 4/1996 |
| JP | 2000-24975 | | 1/2000 |
| JP | 2001-191288 | | 7/2001 |

OTHER PUBLICATIONS

English language Abstract of JP 3-109784.
English language Abstract of JP 56-28894.
English language Abstract of JP 2000-24975.
English language Abstract of JP 1-113399.
English language Abstract of JP 2001-191288.

* cited by examiner

TOOL EXCHANGE DEVICE AND TOOL

CROSS-REFERENCE TO RELATED APPLICATIONS

This application is a divisional of U.S. patent application Ser. No. 10/538,178, filed on Jun. 9, 2005, which is a U.S. National Phase Application of PCT/JP2003/015568, file on Dec. 4, 2003, which claims priority of Japanese Application No. 2002-361626, filed on Dec. 13, 2002, the disclosures of which are expressly incorporated herein by reference in their entireties.

TECHNICAL FIELD

The present invention relates to a tool exchange device that changes a tool mounted at each of heads for various kinds of operation such as a part taking-out head or a mounting head for use in an electronic component mounting device, and such a tool.

BACKGROUND ART

An electronic component mounting device holds an electronic component with a part taking-out head or a mounting head at its component supply portion, and mounts the component in a prescribed location at a substrate with the mounting head. These heads are provided with replaceable tools to hold electronic components, so that the tools can be exchanged with tools having suction nozzles suitable for electronic components to be dealt with depending on the shape and size of the components. In order to efficiently exchange tools, there has been a known device that includes a tool exchange device having various tools within a movable range for the heads, so that tools can arbitrarily be exchanged with necessary tools held at the holding portion as disclosed by Japanese Patent Laid-Open Publication No. 2001-191288.

An example of the conventional tool exchange device of this type will be described with reference to FIGS. 8 and 9. As shown in FIG. 8, a tool 41 has a grip portion 43 to be gripped by a head H (see FIG. 9) on the top of the main body portion 42, and an operation portion 44 (see FIG. 9) such as a suction nozzle underneath. Square engagement wings 45 are provided to project on both end sides of a diameter of the main body portion 42 for detaching/attaching the tool 41 from/to the head H.

As shown in FIG. 9, the tool exchange device 50 is provided with a holding portion 51 that holds the main body portion 42 of the tool 41 mounted thereon. The operation portion 44 is stored in the holding portion 51 and a fitting recess 52 to position the tool 41 is formed. Engagement members 53 that engage with the engagement wings 45, projecting on both sides of the holding portion 51, from above are provided movably between the engaging position and the withdrawal position.

When the tool 41 mounted on the head H is exchanged, the head H is positioned immediately above the vacant space of the holding portion 51, the engagement portions 53 in the location are moved to the withdrawal position, and the head H is lowered. In this way, the operation portion 44 of the tool 41 is fitted and stored in the fitting recess 52, so that the main body portion 42 is placed on the holding portion 51. After the engagement portions 53 are moved to the engagement position, the head H is elevated to cause the tool 41 to be detached from the head H, and then the head H is positioned immediately above the next tool 41 to be mounted and lowered, so that the head H grips the grip portion 43. After the engagement members 53 are moved to the withdrawal position, the head H is elevated and thus the tool exchange process ends.

In the electronic component mounting device including the tool exchange device 50 as described above, the engagement wings 45 are largely projected on the sides of the main body portion 42 of the tool 41, and therefore as shown in FIG. 10, when the head H having the tool 41 mounted thereon holds the electronic component P and is then turned around the axial center C1 and pivoted around an arbitrary axial center C2, any member present within the range of the turning radius R of the edges of the engagement wings 45 projecting from the main body portion 42 of the tool 41 could interfere with the edges. Therefore, a large space must be secured around the head H for providing other members and devices, which does not allow compact arrangement and increases the size of the tool exchange device 50 as a whole.

The tool 41 is positioned in the holding portion 51 as the operation portion 44 is fitted into the fitting recess 52, and the fitting gap must be relatively large in order to achieve smooth fitting. Therefore, the positioning accuracy for the tool 41 cannot be improved, and the tools 41 must be exchanged while their positions are recognized. Consequently, the tact time to exchange tools cannot be reduced, which prevents the overall mounting speed from being increased.

The invention is directed to a solution to the above-described disadvantages associated with the conventional techniques, and it is an object of the invention to provide a tool exchange device and a tool that allow the arrangement around the head to be compact when the head having the tool is turned in an arbitrary direction and that allow tools to be positioned with high precision and be exchanged with short tact time.

DISCLOSURE OF THE INVENTION

A tool exchange device according to the invention includes: step portions with an L-shaped section having vertical restriction surfaces diametrally opposing and parallel to each other and horizontal engagement surfaces directed radially outwardly from the lower ends on both sides of a main body portion of a tool; a first engagement member provided on one side of a holding portion that places and holds a tool for exchange, the first engagement member having a first engagement projection piece opposing the engagement surface of one of the step portions and having its end surface in abutment against the restriction surface; a second engagement member provided on the other side of the holding portion, the second engagement member having a second engagement projection piece having its intermediate part opposed to the engagement surface of the other of the step portions, and having its end surfaces on both sides in abutment against the outer periphery of the main body portion on the both sides of the step portion; and moving unit which moves the first and second engagement members between an engagement position and a withdrawal position with respect to the step portions.

In this way, simply by providing step portions with an L-shaped section on both sides of the main body of the tool instead of providing portions projecting from the main body portion, a large interference avoidance space is not necessary around the head even if the head having the tool mounted thereon is turned in an arbitrary direction, so that more compact arrangement is enabled, and the size of the tool exchange device as a whole is reduced. The tool is positioned in three points in total, i.e., an engagement point between an end surface of the first engagement projection piece and the restriction surface, and a pair of engagement points between end surfaces on both sides of the second engagement projection piece and the outer periphery of step portions of the main body portion, so that the tool is positioned with high precision. Therefore, the head is lowered for exchange operation as soon as it is positioned, so that tools are suitably exchanged with short tact time.

The moving unit includes: a moving guide that movably supports the first and second engagement members between the engagement position and the withdrawal position; energizing units for energizing the first and second engagement members to move toward the engagement position; wedge members engageable with engagement rollers provided at the first and second engagement members; and moving unit for the wedge members. When the energizing force by the energizing unit for the first engagement member is set greater than the energizing force by the energizing unit for the second engagement member, a reference position for positioning a tool is set by the first engagement member, and the position of the tool is restricted by the second engagement member. The wedge members are moved by the moving unit to cause the first and second engagement members to move between the engagement position and the withdrawal position, so that engagement/disengagement operation is carried out in a simple configuration while positioning with high precision is enabled.

A tool according to the invention comprises: a grip portion to be gripped by a head at the top of a main body portion with an approximately circular shape in a plan view; and an operation portion underneath. In this tool, notches having step portions with an L-shaped section are provided at both sides of the main body portion, the step portions include vertical restriction surfaces diametrally opposing and parallel to each other, and horizontal engagement surfaces directed radially outwardly are provided at the lower ends of the vertical restriction surfaces. In this way, the above-described advantages are achieved.

BEST MODE FOR CARRYING OUT THE INVENTION

Now, a tool exchange device according to an embodiment of the invention will be described in conjunction with FIGS. 1 to 7.

Figure 1:
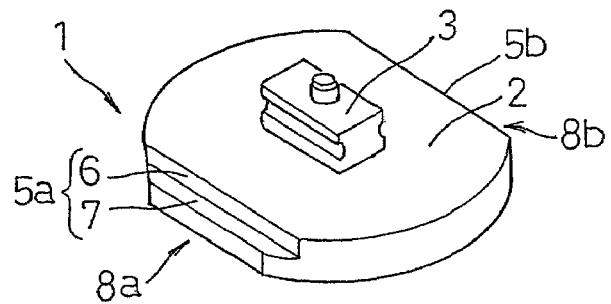
FIG. 1 is a perspective view of a tool for use in a tool exchange device according to one embodiment of the invention.
Figure 2A:
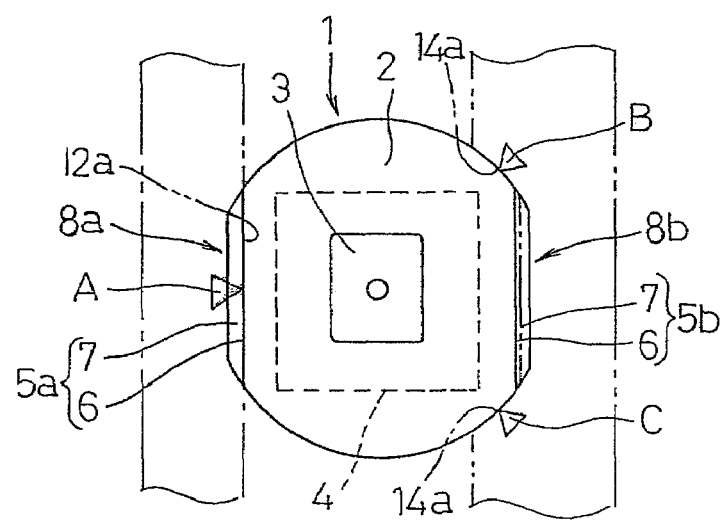
FIGS. 2A and 2B are schematic views of the tool exchange device according to the embodiment, FIG. 2A being a plan view mainly showing a tool, FIG. 2B being a vertical sectional view thereof seen from the front.

As shown in FIGS. 1 and 2A, a tool 1 for use in a tool exchange device according to the embodiment has a grip portion 3 to be gripped by a head at the upper portion of the main body portion 2 having an approximately circular shape in a plan view, and an operation portion 4 such as a suction nozzle underneath. Notches 8a and 8b having step portions 5a and 5b with an L-shaped section are provided on both sides of the main body portion 2. The step portions have vertical restriction surfaces 6 diametrally opposing and parallel to each other and horizontal engagement surfaces 7 extending outwardly from their lower ends.

Figure 2B:
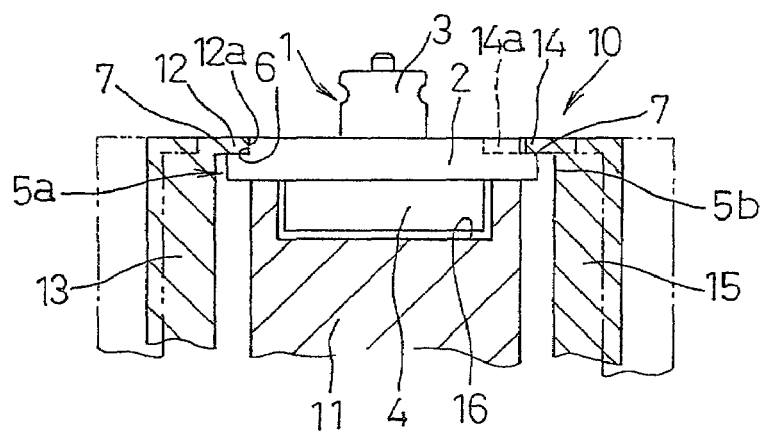
Figure 3:
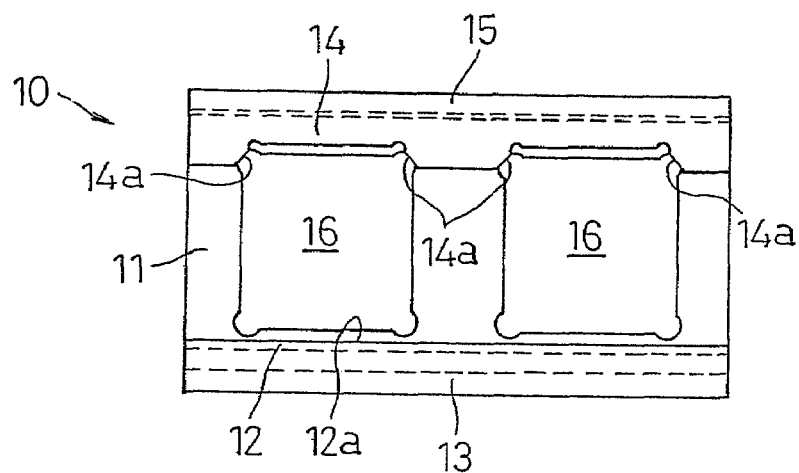
FIG. 3 is a plan view of a specific example of the embodiment.

As shown in FIGS. 2A and 2B, the tool exchange device 10 includes a storing recess 16 that stores the operation portion 4 of the tool 1 at the upper surface of the holding portion 11 that places and holds the tool 1 mounted for exchange, so that the main body portion 2 is placed and supported on the upper surface of the holding portion 11. On one side of the holding portion 11, there is a first engagement member 13 having a first engagement projection piece 12 opposing the engagement surface 7 of one 5a of the step portions and having its end surface 12a in abutment against the restriction surface 6. On the other side of the holding portion 11, there is a second engagement member 15 having a second engagement projection piece 14 having its intermediate part opposed to the engagement surface 7 of the other 5b of the step portions and its end surfaces 14a on both sides in abutment against the outer periphery of the main body portion 2 on both sides of the step portion 5b. The first and second engagement members 13 and 15 are moved between the position where they are engaged with the step portions 5a and 5b as denoted by the solid line and the position where they are withdrawn from the step portions 5a and 5b as denoted by the imaginary line.

In this way, the step portions 5a and 5b having an L-shaped section are provided on both sides of the main body portion 2 of the tool 1 instead of the portions projecting from the main body portion 2, and therefore there is no need for a large interference avoidance space around the head even when the head having the tool 1 mounted thereon is turned in an arbitrary direction. Therefore, more compact arrangement is enabled, and the size of the tool exchange device 10 as a whole is reduced.

As shown in FIG. 2A, the tool 1 is positioned in three engagement points A, B, and C, i.e., the engagement point A between the end surface 12a of the first engagement projection piece 12 and the restriction surface 6 of the step portion 5a, and the engagement points B and C between the end surfaces 14a on both sides of the second engagement projection piece 14 and the outer periphery on both sides of the step portion 5b of the main body portion 2. Therefore, the tool 1 is positioned with high precision.

When the tools 1 are exchanged at a head H (see FIG. 4), the head H having the tool 1 to be exchanged is positioned immediately above the vacant space of the holding portion 11 and lowered after the first and second engagement members 13 and 15 at the holding portion are moved to the withdrawal position, the operation portion 4 of the tool 1 is stored into the storing recess 16, and the main body portion 2 is placed on the upper surface of the holding portion 11. Then, the first and second engagement members 13 and 15 are moved to the engagement position. The head H is then elevated, so that the tool 1 is removed from the head H. The head is then positioned immediately above the tool 1 to be mounted and lowered, so that the head H grips the grip portion 3. The head H is elevated after the engagement members 13 and 15 are moved to the withdrawal position, and thus the tool exchange process ends. During the tool exchange process, the tool 1 is positioned with high precision as described above, and therefore the head H is lowered to carry out the exchange as soon as the head H is positioned immediately above the tool 1. Therefore, the tool exchange is carried out with short tact time.

Now, referring to FIGS. 3 to 7, a specific example of the arrangement of the tool exchange device 10 that holds two tools 1 will be described. Note that at a tool exchange portion in an actual electronic component mounting device, a plurality of such tool exchange devices 10 are provided in parallel, and many tools 1 are exchanged.

As shown in FIGS. 3 to 7, the holding portion 11 is made of a block having a rectangular shape in a plan view and an approximately T-shape in a sectional view and provided on a support bracket 17. At the upper surface of the holding portion 11, two square storing recess portions 16 to store the operation portions 4 of the tools 1 are formed at an appropriate interval in the longitudinal direction, so that the main body portions 2 of the tools 1 are placed and held on the upper surface.

Figure 4:
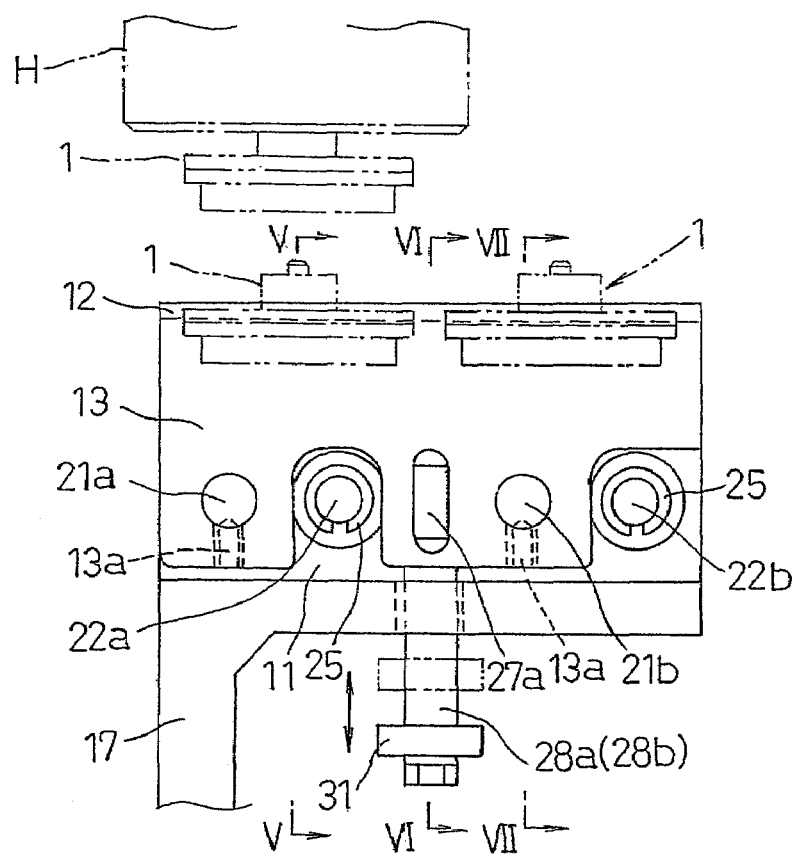
FIG. 4 is a front view of the specific example of the embodiment shown in FIG. 3.

The first engagement member 13 is securely coupled by setscrews 13a to one end of a pair of moving shafts 21a and 21b fitted into fitting holes 18 formed through the holding portion 11 and movably supported by a linear bearing 20 fixed with snap rings 19a and 19b. The second engagement member 15 is securely coupled by setscrews 15a to a pair of moving shafts 22a and 22b on the other end thereof also fitted into the fitting holes 18 formed through the holding portion 11 and movably supported by the linear bearing 20 fixed with the snap rings 19a and 19b. As shown in FIG. 4, among these moving shafts 21a, 21b, 22a, and 22b (also referred to as "moving guides"), the moving shafts 21a and 22a are provided on one side in the longitudinal direction of the holding portion 11 and the moving shafts 21b and 22b are provided on the other side in these order at prescribed intervals.

Figure 5:
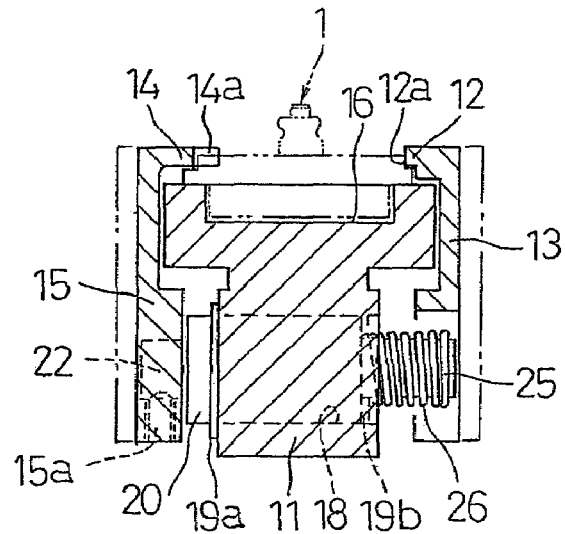
FIG. 5 is a sectional view taken along the line V-V in FIG. 4.
Figure 7:
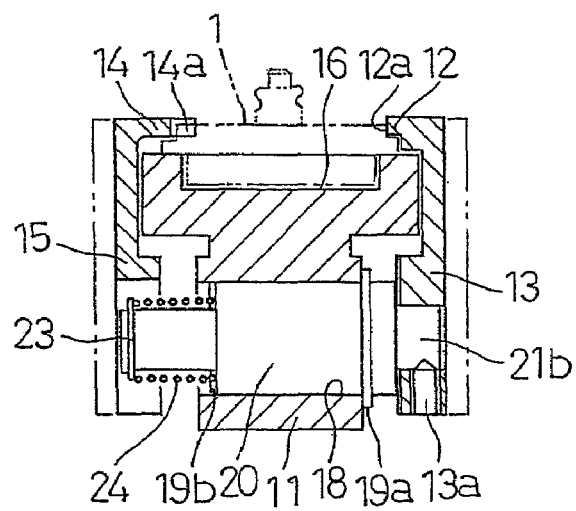
FIG. 7 is a sectional view taken along the line VII-VII in FIG. 4.
Figure 8:
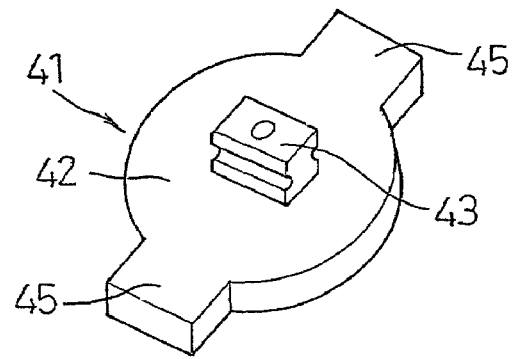
FIG. 8 is a perspective view of a conventional tool.
Figure 9:
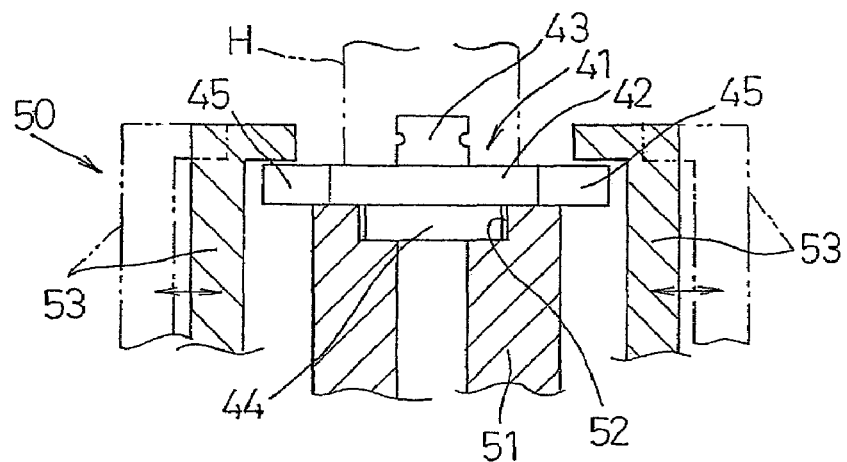
FIG. 9 is a schematic vertical sectional view of the arrangement of a conventional tool exchange device viewed from the front.
Figure 10:
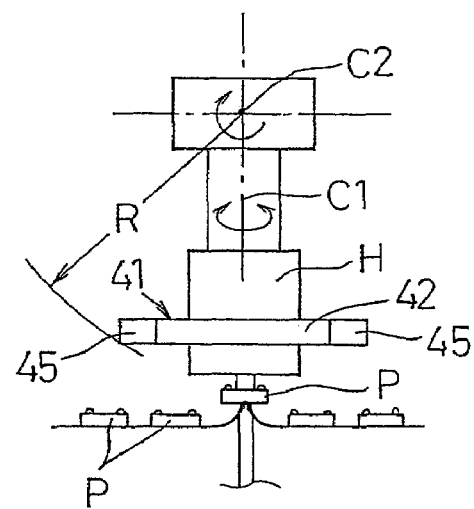
FIG. 10 is a view for use in illustration of problems associated with the conventional device.

A first compression spring 24 is interposed between a ring 23 fixed to the moving shafts 21a and 21b on the other end and the linear bearing 20, and as shown in FIG. 7, the spring energizes the first engagement member 13 to move toward the engagement position denoted by the solid line. A second compression spring 26 is interposed between a ring 25 fixed to the moving shafts 22a and 22b on one end and the linear bearing 20, and as shown in FIG. 5, the spring energizes the second engagement member 15 to move toward the engagement position denoted by the solid line. The spring constant of the first compression spring 24 is set larger than the spring constant of the second compression spring 26, and the first engagement member 13 restricts the reference position while the second engagement member 15 restricts the main body portion 2 of the tool 1 toward the reference position.

Figure 6:
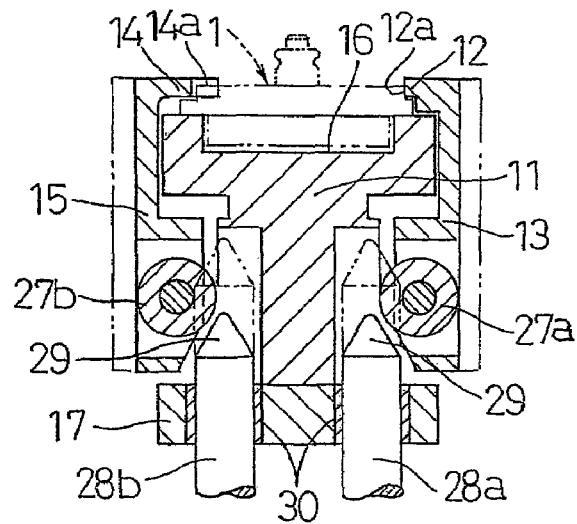
FIG. 6 is a sectional view taken along the line VI-VI in FIG. 4.

In the central position in the longitudinal direction in the holding portion 11 and the engagement members 13 and 15, as shown in FIG. 6, the first engagement member 13 and the second engagement member 15 are provided with engagement rollers 27a and 27b, respectively, and operation shafts 28a and 28b having conic wedges 29 engageable with the engagement rollers 27a and 27b are provided on the upper ends. When these operation shafts 28a and 28b are moved upward, the engagement rollers 27a and 27b are pressed by the wedges 29, so that the first and second engagement members 13 and 15 are moved to the withdrawal position against the energizing force of the first and second compression springs 24 and 26. The operation shafts 28a and 28b are supported movably in the vertical direction by a bearing 30 provided in and through the support bracket 17, and are driven to move in the vertical direction by moving means 31 (see FIG. 4).

In this way, the first engagement member 13 sets the reference position for the main body portion 2 of the tool 1, the second engagement member 15 restricts the position of the main body portion 2, and the moving means 31 elevates/lowers the operation shafts 28a and 28b having the wedges 29 at the upper ends, so that the first and second engagement members 13 and 15 are moved between the engagement position and the withdrawal position. Therefore, engagement/disengagement operation is carried out in a simple manner while positioning with high precision is enabled.

INDUSTRIAL APPLICABILITY

As in the foregoing, according to the invention, a step portion with an L-shaped section is provided on both sides of the main body portion of a tool instead of portions projecting from the main body portion of the tool. In this way, when the head having a tool mounted thereon is turned in an arbitrary direction, a large interference avoidance space is not necessary around the head, so that more compact arrangement is enabled. The positioning of the tool is carried out in three points in total, i.e., in an engagement point between an end surface of the first engagement projection piece and the restriction surface, and in a pair of engagement points between end surfaces on both sides of the second engagement projection piece and the outer periphery on both sides of the step portion of the main body portion, so that the tool is positioned with high precision. Therefore, the head is immediately lowered for exchange operation as soon as it is positioned, so that tools are suitably exchanged with short tact time.

What is claimed is:
1. A tool, comprising:
a main body portion having an approximately circular shape;
a grip portion provided on top of the main body portion and configured to be gripped by a head; and
a suction nozzle provided underneath the main body portion,
wherein step portions are provided at opposite sides of the main body portion to form L-shaped sections, the step portions comprising vertical restriction surfaces diametrally opposing and parallel to each other, and horizontal engagement surfaces extending outwardly from lower ends of the vertical restriction surfaces.
2. A tool according to claim 1, wherein the horizontal engagement surfaces face towards a top of the tool.

* * * * *